Nov. 15, 1960 M. E. BRODWIN 2,960,664

WIDE BAND NOISE SOURCE

Filed May 21, 1957 2 Sheets-Sheet 1

INVENTOR.
MORRIS E. BRODWIN
BY Wade Koontz
ATTORNEY and
Richard J. Kilburn
AGENT Nov. 15, 1960 M. E. BRODWIN 2,960,664

WIDE BAND NOISE SOURCE

Filed May 21, 1957 2 Sheets-Sheet 2

INVENTOR.
MORRIS E. BRODWIN
BY Wade Koontz
ATTORNEY
Richard J. Killoren
AGENT

United States Patent Office 2,960,664

Patented Nov. 15, 1960

2,960,664

WIDE BAND NOISE SOURCE

Morris E. Brodwin, Baltimore, Md., assignor to the United States of America as represented by the Secretary of the Air Force Filed May 21, 1957, Ser. No. 660,728

4 Claims. (Cl. 331—78)

This invention relates to a wide band noise source which operates on the principle of simultaneously modulating a number of harmonically related signals with narrow-band noise.

One object of the invention is to produce a wide band noise source capable of producing sufficient noise power to measure noise figures up to 80 decibels.

Another object is to provide a wide band noise source capable of producing a spectrum which is flat ±2 decibels over the range of from 3 megacycles to 250 megacycles.

These and other objects will become apparent from the following detailed description together with the drawing wherein.

Figure 1:
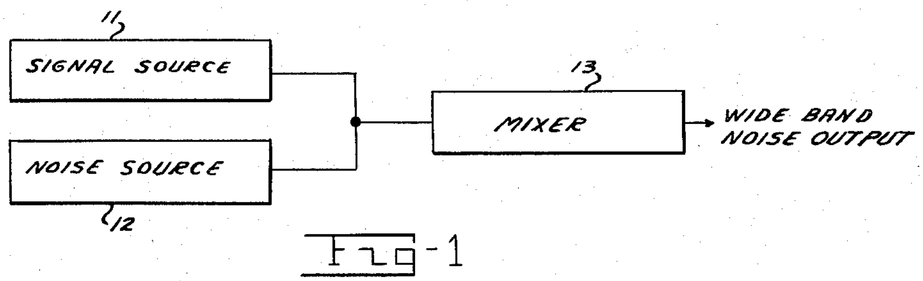
Fig. 1 is a block diagram of a generalized circuit for the wide band noise source of the invention.

In the generalized circuit of Fig. 1, the signal from signal source 11 is noise modulated with noise from a noise source 12 in a mixer circuit 13. The signal source 11 may be any type of device capable of producing discrete frequencies separated by a few megacycles, for example, is may be an oscillator capable of oscillating simultaneously in many different modes or it may be a pulse source for producing very short pulses with a high repetition rate. The output of the signal source must consist of discrete frequencies with a constant amplitude distribution over a wide range of frequencies up to between 200 and 250 megacycles.

The noise source 12 need have a bandwidth of the order of only a few megacycles and sufficient power to produce noise sidebands without excessive clipping or over-modulation. The output of the mixer will contain both the individual frequencies of the signal source and the noise sidebands produced by the mixing action.

Figure 2:
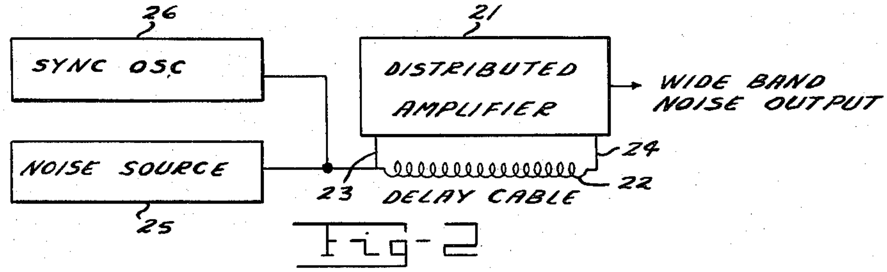
Fig. 2 is a block diagram illustrating a wide band noise source of the invention using a distributed amplifier with a feedback loop.

One wide band noise source that has been constructed is shown in Fig. 2 wherein the signal source and mixer are combined in one unit. In this system a distributed amplifier 21 has a long feedback cable 22 connected between the output 24 and the input 23. This amplifier with the feedback loop oscillates thereby producing a number of harmonically related frequencies between 3 and 200 megacycles. A three megacycle noise source 25 is connected to the input terminals of the amplifier and produces noise sidebands by grid modulation. A synchronizing oscillator 26 is employed to force the delay line to operate in the proper modes.

This system can be analyzed by writing the equations for a feedback amplifier and solving for the oscillating conditions.

The amplifier has a complex gain characteristic denoted by $\overline{A}$. The characteristic of the feedback network is denoted by $\overline{B}$. From standard methods of linear feedback analysis, the system gain $\overline{A^1}$ with the loop closed is given by:

$$\overline{A}^1 = \frac{\overline{A}}{1-\overline{AB}} \qquad (1)$$

The system will oscillate when $\overline{AB}=1$.

Let $$\overline{A}=u+Jv \qquad 1(a)$$

$$\overline{B}=x+Jy \qquad 1(b)$$

where $u, v, x, y$, are functions of frequency.

The system will oscillate when $(u+Jv)(x+Jy)=1$ or when $$ux-vy=1 \qquad 2(a)$$

and $$vx+uy=0 \qquad 2(b)$$

The variables $u, v, x, y$ may be expressed as:

$$u=A\cos\theta \qquad 3(a)$$

$$v=A\sin\theta \qquad 3(b)$$

$$x=B\cos\phi \qquad 3(c)$$

$$y=B\sin\phi \qquad 3(d)$$

Then by substituting Eqs. 3$a$, $b$, $c$, $d$ into Eqs. 2$a$, $b$ yields:

$$AB\cos(\phi+\theta)=1 \qquad 4(a)$$

$$AB\sin(\phi+\theta)=0 \qquad 4(b)$$

Equation 4$b$ is satisfied when $\phi+\theta=n\pi$, with $n=0$, 1, 2, etc.

Substituting this condition into Eq. 4$a$ yields:

$$AB=\pm1 \qquad (5)$$

From Equation 1 it was shown that the system will oscillate when $\overline{AB}=1$, consequently only the positive values will be acceptable and $n$ must be even.

The conditions under which the system will oscillate are:

$$\phi+\theta=m\pi \qquad 6(a)$$

$$AB=1 \qquad 6(b)$$

where $m$ is an even number.

These conditions may be satisfied at a number of frequencies by means of a long delay line for the feedback loop. Cable 22 consists of 150 feet of RG–62/V which has the following characteristics:

| | |
|---|---|
| Character impedance | 93 ohms. |
| Jacket diameter | .242 inch. |
| Shield | Copper. |
| Outer diameter of dielectric | .146 inch. |
| Inner conductor | 22 AWG Copperweld. |
| Phase velocity | 84% of free space velocity. |
| Capacitance | 13.5 mmfd./ft. |
| Maximum operating voltage | 750 volts. |
| Attenuation at 300 mc | 5.5 db/100 feet. |

Figure 3:
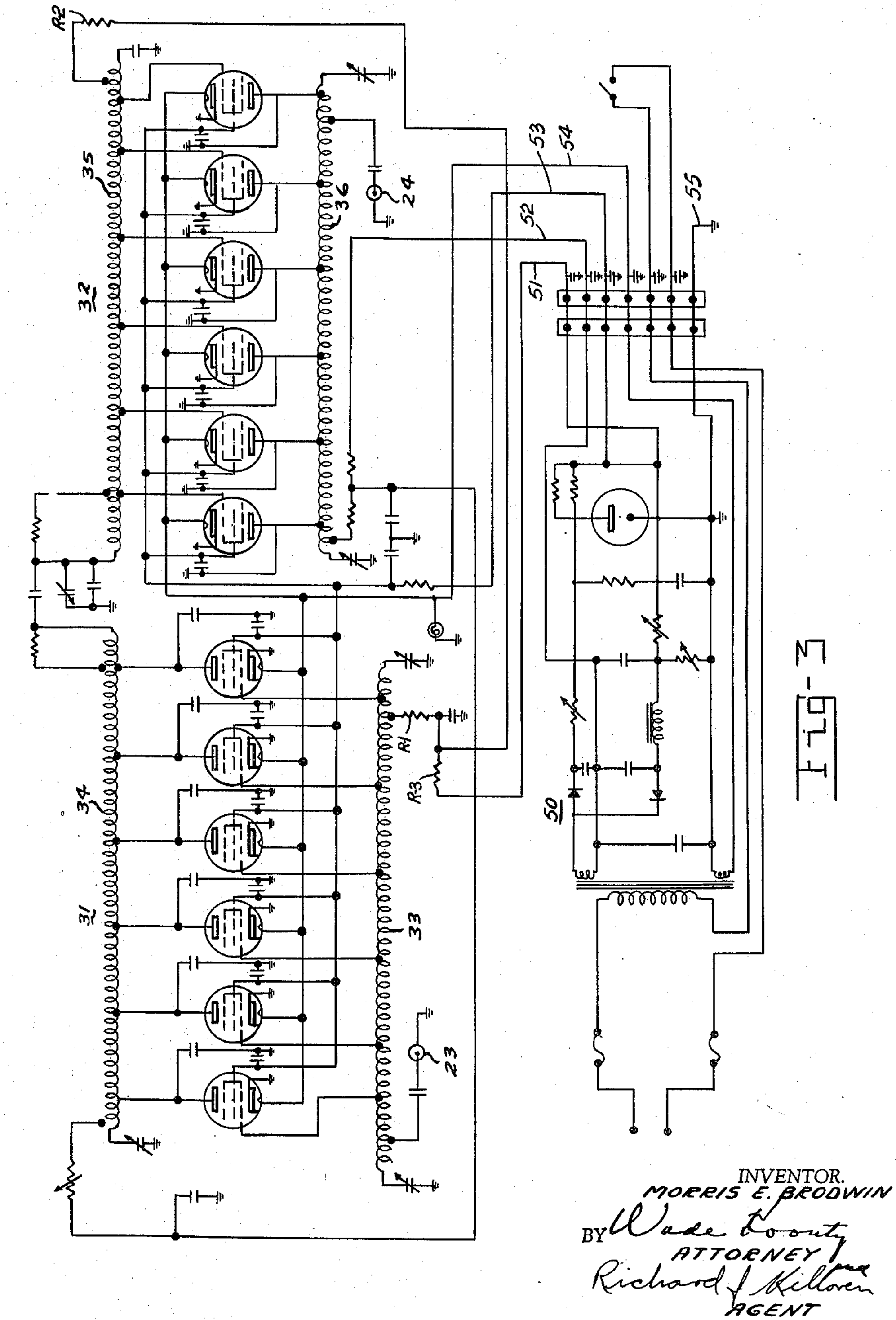
Fig. 3 is a circuit schematic of a wide band distributed amplifier which can be used in the device of Fig. 2.

The distributed amplifier is a wide-band chain amplifier as shown in Fig. 3 having two traveling wave stages 31 and 32 of six tubes each. The grids of the tubes in stage 31 are connected to successive taps on a coil 33 which forms the inductance of the grid delay line. The anodes are connected to successive taps on coil 34. The grids and anodes of stage 32 are connected to successive taps on coils 35 and 36, respectively. A small capacitance may be added to each coil tap to keep the surge impedance and velocity of propagation of the wave along the plate line equal to that along the grid line. The voltages for the distributed amplifier are provided by power supply 50 which has voltage taps 51, 52, 53, 54 and ground lead 55. The grid bias for stages 31 and 32 is applied through resistors R–1 and R–2 which are connected to the voltage tap 51 through resistor R–3. The anode supply is taken off at tap 52 and the heater voltage is taken off at tap 54.

Figure 4:
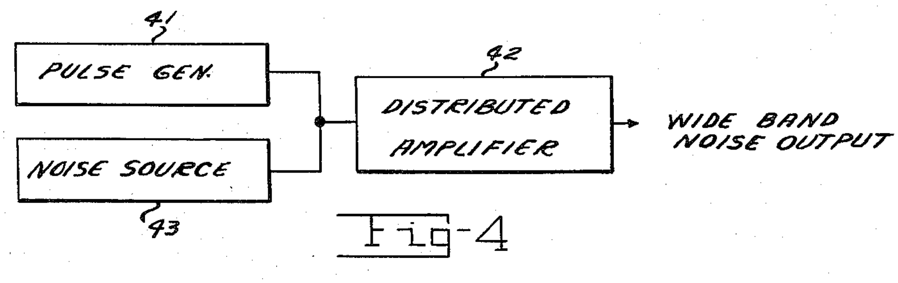
Fig. 4 is a block diagram of another embodiment wherein a distributed amplifier, such as that shown in Fig. 3, is used as a mixer in a noise modulated pulse system.

The system of Fig. 4 has a pulse source 41 which produces very short pulses with appreciable harmonics up to at least 200 megacycles. The output of the pulse source is fed to the grid line of a distributed amplifier 42. The pulse signal is modulated by a noise signal from noise source 43 by grid modulation in the distributed amplifier 42. The voltage from the noise source should have sufficient amplitude to force the amplifier into a nonlinear region.

One system tested used $17\times10^{-3}\mu$-sec. pulses at a repitition rate of 5 megacycles. The output of the pulse generator consisting of a series of positive and negative pulses is fed into the grid line of a distributed amplifier having two stages. The first stage is biased beyond cutoff and conducts only on the application of positive pulses. The second stage is made to operate with normal gain. The system is modulated with a 5 megacycle noise source. This device will produce a substantially flat spectrum over a wide range of frequencies.

There is thus provided a wide band noise source which can be used for jamming radar and which is capable of producing sufficient noise power to measure noise figures up to 80 decibels.

While certain specific embodiments have been described, it is to be understood that numerous changes may be made without departing from the general principles and scope of the invention.

I claim:

1. A wide band noise source comprising a distributed amplifier, a feedback cable connected between the output and input of said amplifier, means for causing said amplifier with the feedback cable to oscillate in a multiplicity of modes, means connected to the grid circuit of said amplifier to apply a noise signal thereto to partially fill in the space between said oscillating modes with noise sidebands.

2. A wide band noise source comprising: a distributed amplifier having a feedback cable connected between the output and input of said amplifier wherein the product of the complex gain characteristic of the amplifier and the characteristic of the feedback cable is equal to 1 and the sum of the phase angles of the amplifier and cable is equal to $m\pi$ where $m$ is an even number, means for causing said amplifier to oscillate in a multiplicity of modes, means connected to the grid circuit of said amplifier to apply a noise signal thereto to partially fill in the space between the oscillating modes with noise sidebands.

3. A wide band noise source, comprising; a distributed amplifier, means for causing said amplifier to oscillate in a multiplicity of modes and means for applying a noise signal to said amplifier to partially fill in the space between said oscillating modes with noise sidebands.

4. A wide band noise source, comprising; a distributed amplifier, a feedback means connected between the output and the input of said amplifier, means for causing said amplifier to oscillate in a multiplicity of modes, means for applying a noise signal to said amplifier to partially fill in the space between said oscillating modes with noise sidebands.

References Cited in the file of this patent

UNITED STATES PATENTS

| | | |
|---|---|---|
| 2,483,226 | Newman | Sept. 27, 1949 |
| 2,562,907 | Haeff et al. | Aug. 7, 1951 |

OTHER REFERENCES

Enslein: "Distributed Amplifier for Nuclear Research," Electronics, July 1954, pp. 138–141.